(12) United States Patent
Negrych et al.

(10) Patent No.: US 6,334,880 B1
(45) Date of Patent: Jan. 1, 2002

(54) ABRASIVE MEDIA AND AQUEOUS SLURRIES FOR CHEMICAL MECHANICAL POLISHING AND PLANARIZATION

(75) Inventors: John A. Negrych, Adrian; George Haag, Manitou Beach; Peter E. Rall, Morenci; William J. Corbell, Weston, all of MI (US)

(73) Assignee: Silbond Corporation, Weston, MI (US)

( * ) Notice: Subject to any disclaimer, the term of this patent is extended or adjusted under 35 U.S.C. 154(b) by 0 days.

(21) Appl. No.: 09/454,586

(22) Filed: Dec. 7, 1999

(51) Int. Cl.$^7$ .............................. C09K 3/14; C09G 1/02
(52) U.S. Cl. .............................. 51/308; 106/3; 423/335; 423/339
(58) Field of Search ............................... 51/308; 106/3; 438/692, 693; 423/335, 339, 336

(56) References Cited

U.S. PATENT DOCUMENTS

| | | | |
|---|---|---|---|
| 4,171,228 A | * 10/1979 | Lowrey | 106/409 |
| 4,842,837 A | 6/1989 | Shimizu et al. | |
| 4,983,369 A | 1/1991 | Barder et al. | |
| 5,100,581 A | * 3/1992 | Watanabe et al. | 51/308 |
| 5,352,277 A | * 10/1994 | Sasaki | 51/308 |
| 5,425,930 A | 6/1995 | Anderson | |
| 5,769,689 A | * 6/1998 | Cossaboon et al. | 51/308 |
| 5,783,489 A | * 7/1998 | Kaufman et al. | 51/308 |
| 5,904,159 A | * 5/1999 | Kato et al. | 51/308 |

OTHER PUBLICATIONS

Controlled Growth of Monodisperse Silica Spheres in the Micron Size Range, Stober et al., Journal of Colloid and Interface Science, 26, 62–69, (1968) (No Month).
Monodisperse Colloidal Silica Spheres from Tetraalkoxysilanes: Practice Formation and Growth Mechanism, Van Blaaderen et al., Journal of Colloid and Interface Science, Dec. 1992, 481–501.
The Chemistry of Silica, Ralph K. Iler, pp. 364–399 Solubility, Polymerization, Colloid and Surface Properties, and Biochemistry, A Wiley–Interscience Publication (No Date).

* cited by examiner

*Primary Examiner*—Michael Marcheschi
(74) *Attorney, Agent, or Firm*—Dougherty & Troxell

(57) ABSTRACT

Non-spherical silica particles having nodular morphology for use as an abrasive media in chemical mechanical polishing are disclosed. Also disclosed are aqueous slurries of monodispersed non-spherical nodular shaped particles having mean effective diameters between about 100 and 300 nanometers for chemical mechanical polishing. In addition aqueous slurries for the chemical mechanical polishing and planarization of oxide dielectric, metal, and metal/metallic compound interlayers of integrated circuits are disclosed.

31 Claims, 7 Drawing Sheets

ABRASIVE MEDIA AND AQUEOUS SLURRIES FOR CHEMICAL MECHANICAL POLISHING AND PLANARIZATION

FIELD OF THE INVENTION

This invention relates to abrasive media, and aqueous slurries for chemical mechanical polishing and planarization of the interlayers of integrated circuits, memory disks, optical lenses, etc. More particularly, the invention relates to non-spherical nodular silica particles that when used as an abrasive media in chemical mechanical polishing provide a rapid rate of material removal, while producing surfaces which are free from unacceptable gouges and/or scratches. The invention also relates to stable aqueous dispersions of monodispersed non-spherical nodular silica particles which are essentially free of sodium, chlorine, lithium and other contaminants. Such slurries are particularly suitable for the chemical mechanical planarization of wafers and interlayers in semiconductor integrated circuit manufacturing.

BACKGROUND OF THE INVENTION

The fabrication of integrated circuits includes a step of providing a substrate, such as a silicon or gallium arsenide wafer having a smooth uniform surface on one side thereof. Various layers, which are either conductive, insulating or semiconductor in nature are then formed on top of the smooth surface. In fabricating such circuits, it is also necessary to form conductive lines or similar structures above a previously formed layer. However, prior surface formations usually leave the top surface topography highly irregular, with bumps, areas of unequal elevation, troughs and other surface irregularities. As a result, global planarization is necessary to ensure adequate focal depth during subsequent photolithography, as well as removing any irregularities and surface imperfections during the various stages of the fabrication process. This planarization is generally accomplished by chemical mechanical polishing (CMP).

The process of chemical mechanical polishing is carried out using aqueous slurries of suitable chemicals and abrasive particles. The chemicals react with the surfaces being polished to form a reaction layer which is then abraded, or rubbed off, by the solid particles contained in the slurry. In many cases these particles are composed of silica. Heretofore, a type of silica known as fumed silica has been the principal source for these particles. Fumed silica is produced by the flame hydrolysis or burning oxidation of silane compounds such as $SiCl_4$, $HSiCl_3$ $CH_3SiCl_3$, $CH_3Si(OCH_3)_3$, and the like. The ultimate, spherical, silica particles produced by the flame hydrolysis or burning oxidation of silane compounds are very small, on the order of 10 to 20 nanometers.

These very small particles aggregate while molten and fumed silica is recovered as tightly bound, or fused, chain-like agglomerates of these ultimate particles. The effective particle diameter of these non-spherical agglomerates after dispersion into a CMP slurry is on the order of 100 nm. Both during the preparation of dispersions from these particles, and in their employment for CMP, the chain-like agglomerates are randomly fractured to produce asperities which can plow or dig into the surface being polished, producing undesirable gouges and scratches. Scratches and gouges remaining in the surface of an interlayer of an integrated circuit after planarization are extremely undesirable because they adversely affect the reliability of subsequent layers, acting as sources of defects and sites for contamination.

Also, the plowing or digging action of fumed silica particles results in some of the particles remaining partially embedded in the polished surface at the conclusion of the CMP process. Therefore, cleaning of the polished surface is difficult, often requiring vigorous mechanical brushing during the cleaning process. Particle contamination of the polished surface of a memory disc, for example, can produce read/write errors. CMP slurries produced with fumed silica have an additional drawback in that they contain traces of chlorine resulting from the silica particles having been produced from chlorosilanes. Chlorides are an especially undesirable contaminant in integrated circuit manufacture.

In efforts to overcome the scratching, gouging and cleaning problems associated with fumed silica particles, spherical silica particles have been employed in CMP slurries. Such spherical particles have been obtained by the well-known technique of subjecting an aqueous sodium or potassium silicate solution to ion-exchange to produce ultrafine silica particles which are subsequently grown in size by Oswalt ripening, or by the hydrolysis of ethyl silicate using the so-called Stober process. The Stober process is disclosed in an article "Controlled Growth of Monodispersed Silica Spheres in a Micron Range," by Stober et al published in the Journal of Colloid and Interface Sci. 26, 62–69 (1968).

While the use of such spherical particles reduces the scratching and cleaning problems associated with slurries made with fumed silica particles, the material removal rate of such slurries, for equal particle concentrations, is dramatically lower. This is associated, of course, with the fact that the coefficient of rolling friction is less than that for sliding friction, and the removal rate of the chemically reacted layer is a function of the frictional force between it and the abrasive particle. While this reduced removal rate can be mitigated to a degree by significantly increasing the particle concentration of the spherical particles in the CMP slurry, this is at the expense of additional material cost, cleaning cost and spent-slurry disposal cost. Also, the slurries made from sodium or potassium silicate have these alkali metals as a contaminant, which are particularly undesirable in the manufacture of integrated circuits.

The CMP slurries of this invention overcome the problems of previous known CMP slurries containing silica particles as the abrasive media in that they provide (i) removal rates comparable to, or better than, fumed silica slurries but with significantly less scratching and improved cleanability, (ii) higher material removal rates than CMP slurries containing spherical silica particles of similar size and particle concentration, and (iii) higher chemical purity. The particles of this invention can be produced from mixtures of an alkoxysilane or alkoxyalkylsilane, ammonia, water and alcohol by adjusting the ratio of ingredients, conditions of particle nucleation and growth so that the final particles are nodular, rather than spherical; the result of two or more spherical nuclei having coalesced to form a single particle during the growth process.

When used as an abrasive media such particles will slide without plowing or digging into the surface being polished, and because of their higher coefficient of friction with the surface being polished will produce higher material removal rates than spherical particles. Also, because of the exceptional levels of chemical purity that can be attained and maintained with the chemicals and process, CMP slurries made with the particles described can have chemical purities previously unattainable.

BRIEF SUMMARY OF THE INVENTION

The present invention contemplates abrasive media and aqueous slurries of such media suitable for use in the chemical mechanical polishing and planarization of semiconductor wafers, the metallic and dielectric interlayers of integrated circuits, memory discs, optical lenses, etc. The particles comprising the abrasive media are preferably at least 50% by weight non-spherical nodular silica particles having maximum linear dimensions of from about 20 to 1000 nanometers (nm). The particles comprise coalesced nuclei which are characterized by continued growth after initial contact.

The slurries in accordance with the present invention comprise aqueous dispersions of monodispersed non-spherical nodular shaped silica particles with concentrations of particles between about 0.5 to about 50% by weight and preferably between about 3 to about 25% by weight. The invention also contemplates aqueous slurries of monodispersed non-spherical nodular silica particles with chemical additions that can render them suitable for the CMP of metals and metal/metallic compound interlayers, as well as oxide glasses.

The invention will now be described in connection with the following photomicrographs.

DESCRIPTION OF THE PHOTOMICROGRAPHS

DETAILED DESCRIPTION OF THE PREFERRED EMBODIMENTS OF THE INVENTION

Figure 1A:
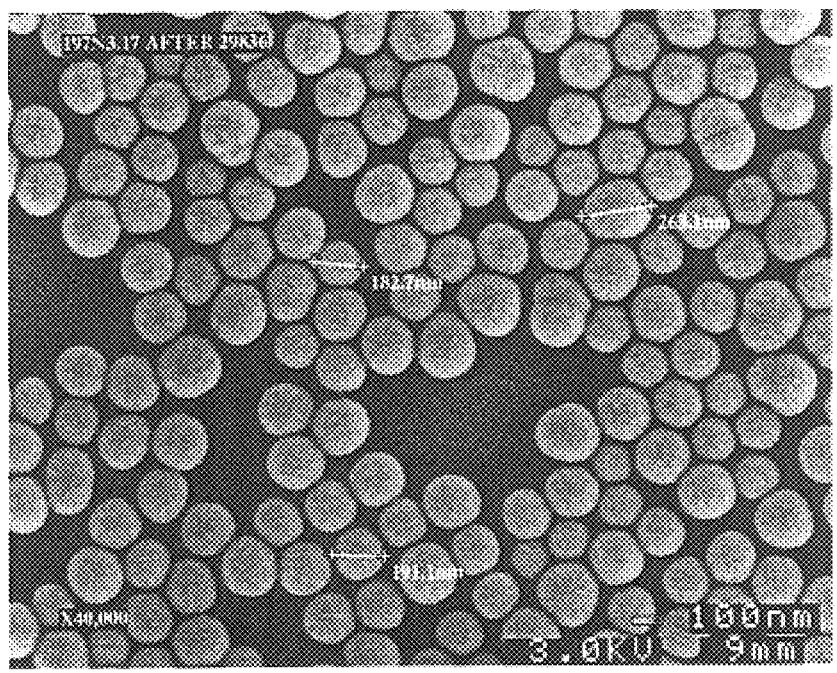
FIGS. 1a and 1b are scanning electron photomicrographs at 40,000 and 80,000 magnification respectively which show generally spherical silica particles which can be used for chemical mechanical polishing but which produce lower polishing rates than the polishing rates of the present invention.

The aforementioned article by Stober et al., the U.S. Patent of Shimizu et al. U.S. Pat. No. 4,842,837, the U.S. Patent of Barder et al. U.S. Pat. No. 4,983,369 and the U.S. Patent of Anderson U.S. Pat. No. 5,425,930 which are incorporated herein in their entirety by reference, disclose processes for producing monodispersed silica microspheres by the addition of an alkoxysilane to an agitated solution of water, alcohol and ammonia, and methods for controlling particle size distribution. The teachings of these investigators, however, are all directed to the production of spherical silica particles rather than the non-spherical nodular silica particles of this invention.

The mechanism behind the formation and growth of silica particles prepared from alkoxysilanes such as tetralkoyxsilanes in alcoholic solutions of water and ammonia was investigated by A. Van Blaaderen, J. Van Geest and A. Vrij. The results of that investigation were reported in the Journal of Colloid and Interface Science, Vol. 154, No. 2, December 1992 at pp. 481–501 which is incorporated herein in its entirety by reference. In one section of that report, they reported on the effects of ionic strength on particle formation and aggregation. These investigators reported that high concentrations of ammonia, or an ionic salt such as $LiNO_3$, could lead to a mix of spherical and non-spherical structures; albeit the percent of non-spherical particles obtained was significantly less than for spherical particles.

In the present invention, the slurries which contain nodular shaped particles are produced from dilute colloidal silica sols of discrete silica spheres or near spheres having diameters less than about 100 nm. These primary particles or nuclei are aggregated, clustered or coalesced into secondary particles consisting of two to six and possibly more primary particles. This coalescence can be achieved by various means, i.e. a change in the pH, addition of a salt, temperature change, ionic concentration of the sol, particle concentration, etc. After coalescence these secondary colloidal particles are grown in size by the deposition of silica polymer produced from the hydrolysis of an alkoxysilane, such as tetraethyl orthosilicate or tetramethyl orthosilicate, or an alkoxyalkylsilane, such as methyl or ethyl triethoxysilane, in the presence of water, alcohol and an alkaline catalyst. As pointed out by Iler in *The Chemistry of Silica*, John Wiley & Sons, pp. 223–4, when spherical silica particles are brought into contact in the presence of soluble silica, or silica monomer, and a catalyst such as a alkali hydroxide, silica monomer will instantly be deposited at the point of contact. Also because of energetics and solubility considerations, additional silica will be preferentially deposited in the neck, or necks, between the coalesced spheres, and the shape of the final particles will be nodular rather than spherical as were the original nuclei. The size of the non-spherical nodular particles is determined by the initial size of the spherical nuclei, the number of spherical nuclei coalesced together, the quantity of alkoxysilane or alkoxyalkylsilane that is polymerized and deposited on the coalesced particles, temperature, and other parameters.

For example, a slurry in accordance with one preferred embodiment of the present invention was prepared as follows:

Batch Formula

| | |
|---|---|
| AR Grade Ammonium Hydroxide | 250 lbs. |
| Tetraethyl Orthosilicate (TEOS) | 350 lbs. |
| DI Water 1, before TEOS addition | 100 lbs. |
| DI Water 2, after TEOS addition | 125 lbs. |

The hydrolysis reaction was carried out in a 100 gallon, continuously agitated Pfaudler reactor and was completed in 31 minutes with a temperature rise of 30° to 50° C. The second water addition, which may be made immediately after hydrolysis or delayed for one or more hours, promotes dispersion stability.

The resulting slurry of approximately 12 weight percent monodispersed non-spherical nodular silica particles was stripped of ammonia and alcohol by vacuum distillation and then adjusted to a pH of 11.0, and solids content of 13.4% using potassium hydroxide and DI water. The resulting slurry had a flash point in excess of 65° C. Adjustment of pH could also have been done with AR grade ammonium hydroxide if this type slurry had been desired. The pH could also be adjusted to acidic using mineral acids, organic acids or materials that hydrolyze to produce an acid pH. The acidic slurries are useful in the chemical mechanical polishing of metals, the basic slurries are useful for the chemical mechanical polishing of oxide glasses.

In the production of slurries to be used for chemical mechanical polishing, it is desirable to produce a slurry of a desired particle diameter and a relatively high particle concentration, while maintaining the particles in a mono-dispersed state. This, of course, is an economic advantage since shipping concentrated slurries reduces freight costs. The alcohol is reduced to about 0.05% to about 5% by weight, so that the flash point of the slurry is raised to an acceptable level. The alcohol and ammonia that is removed can be recovered and recycled, thereby reducing the disposal cost of process waste.

In the above example the nuclei particles were formed, coalesced and grown into nodular particles in a continuous process. However, it is within the scope of this invention to begin with a dilute aqueous sol of spherical nuclei, coalesce them by one of the techniques previously described, and grow the coalesced particles into nodular particles by the addition of an alkoxysilane or alkoxyalkylsilane, an alkaline catalyst, and an alcohol if needed.

The fabrication of integrated circuits includes a step of providing a substrate, such as a silicon or gallium arsenide wafer having a smooth uniform surface on one side thereof. Various layers, which are either conductive, insulating or semiconductor in nature are then formed on top of the smooth surface. In fabricating such circuits, it is also necessary to form conductive lines or similar structures above a previously formed layer. However, prior surface formations usually leave the top surface topography highly irregular, with bumps, areas of unequal elevation, troughs and other surface irregularities. As a result, global planarization is necessary to ensure adequate focal depth during subsequent photolithography, as well as removing any irregularities and surface imperfections during the various, stages of the fabrication process.

The dielectric oxide interlayers in such devices are exceptionally hard and difficult to planarize at an economically effective rate. Accordingly, slurries in accordance with the present invention have been developed in order to more rapidly and economically planarize such surfaces, without leaving gouges or deep scratches or high levels of adherent abrasive particles therein.

The following table provides a comparison between several slurries in accordance with the present invention, i.e. slurries of monodispersed non-spherical nodular silica particles and several slurries of spherical particles having mean effective diameters similar to those of the nodular particles. The chemical mechanical polishing was performed on thermal oxide dielectric layers deposited on silicon wafers. The rate of material removal was determined using a Strasbaugh 6EC polisher, IC1400-A1 pad, quill rpm 30, table rpm 150, downward force of 8 psi and a slurry feed rate of 125 ml/min at a temperature of between 25° to 27° C. In the table, the example or lot number is listed in the left-hand column and includes a "K" or "N" to identify whether the pH was adjusted by adding $NH_4OH$ or KOH. The second column gives the molar ratio of ammonia to tetraethyl orthosilicate used in producing the particles of the slurry. The third column shows the rate of dielectric material removal in angstroms per minute, while the fourth column shows the mean effective particle diameter in nanometers (nm). The fifth column shows the coefficient of variation for the particle size distribution. The percent solids, pH and principal particle morphology are also shown.

| PP Lot# | NH3/ TEOS | Thermal Oxide Rrate A/min | EAPS nm | CV % | Solids w/o | pH | Morphology |
|---|---|---|---|---|---|---|---|
| 197N | 3.17 | 1100 | 173 | 21.2 | 13.2 | 11.1 | spherical |
| 157N | 2.97 | 2000 | 171 | 15.4 | 13.7 | 11.0 | spherical |
| 181K | 2.97 | 2000 | 164 | 13.9 | 13.9 | 11.0 | spherical |
| 196N | 2.76 | 2750 | 160 | 18.0 | 13.1 | 11.0 | nodular |
| 196K | 2.76 | 3090 | 157 | 19.1 | 13.7 | 10.9 | nodular |
| 194N | 2.65 | 3187 | 167 | 18.9 | 13.4 | 11.0 | nodular |
| 230N | 2.56 | 3761 | 158 | 20.0 | 13.9 | 10.8 | nodular |
| 133K | 2.56 | 4000 | 178 | 20.2 | 13.4 | 11.0 | nodular |

Figure 1B:
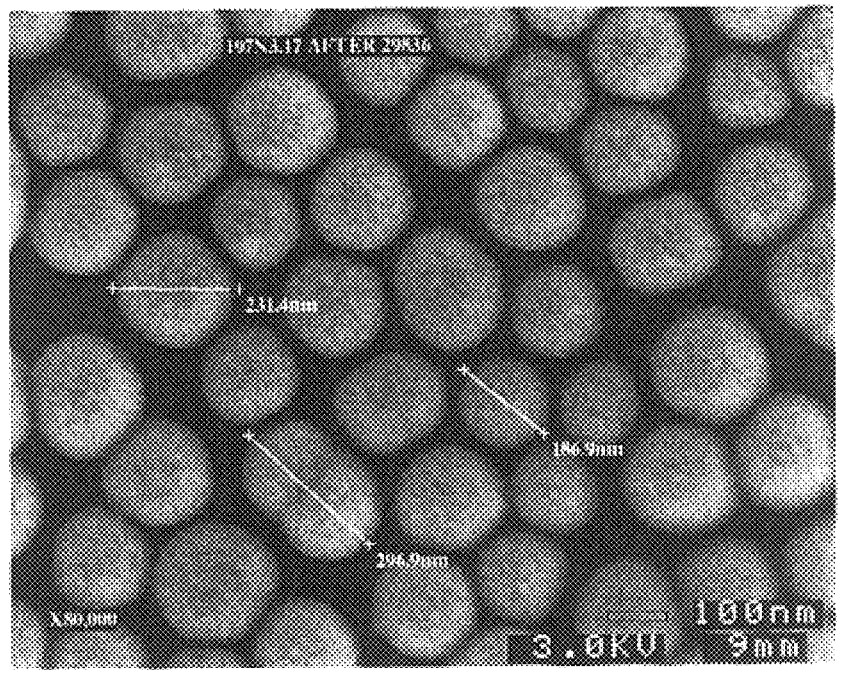
Figure 2A:
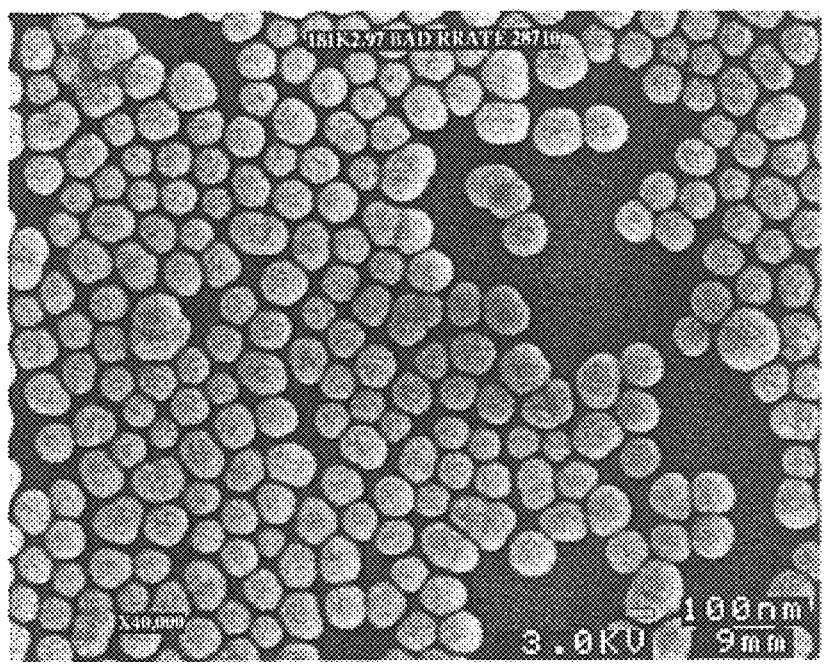
FIGS. 2a and 2b are scanning electron photomicrographs at 40,000 and 80,000 magnification respectively which illustrate spherical silica particles as obtained in a second comparison example.
Figure 2B:
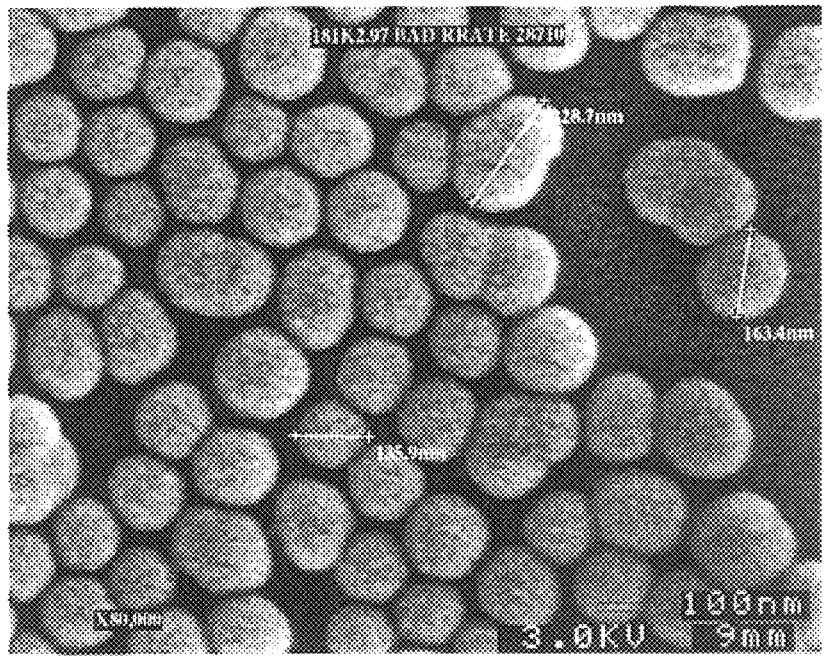
Figure 3A:
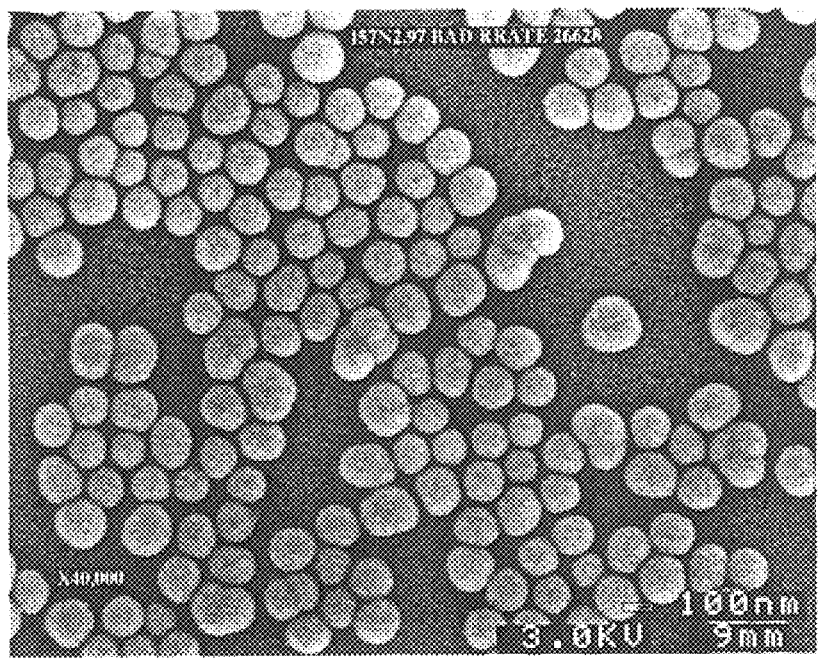
FIGS. 3a and 3b are scanning electron photomicrographs at 40,000 and 80,000 magnification respectively which illustrate non-spherical nodular shaped silica particles according to a first embodiment of the invention.
Figure 3B:
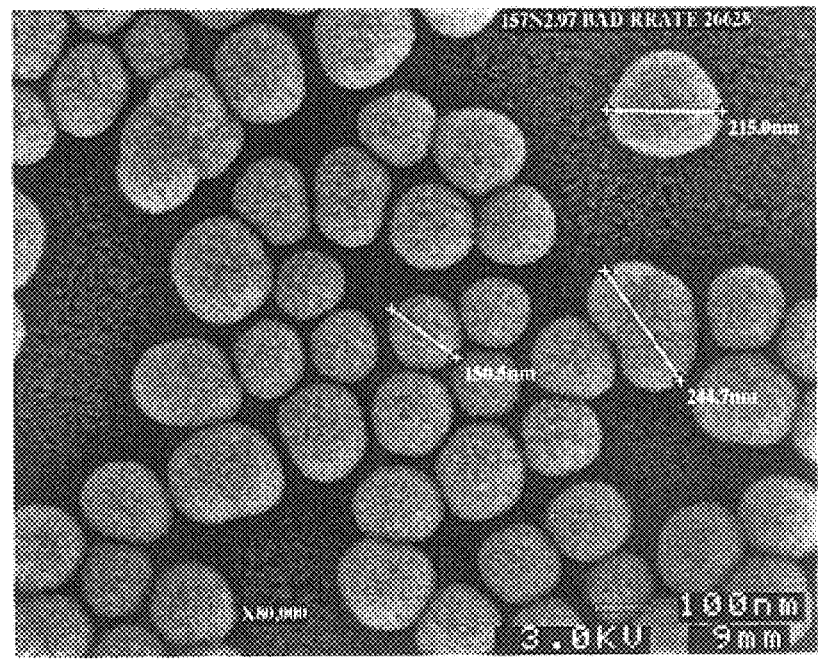
Figure 4A:
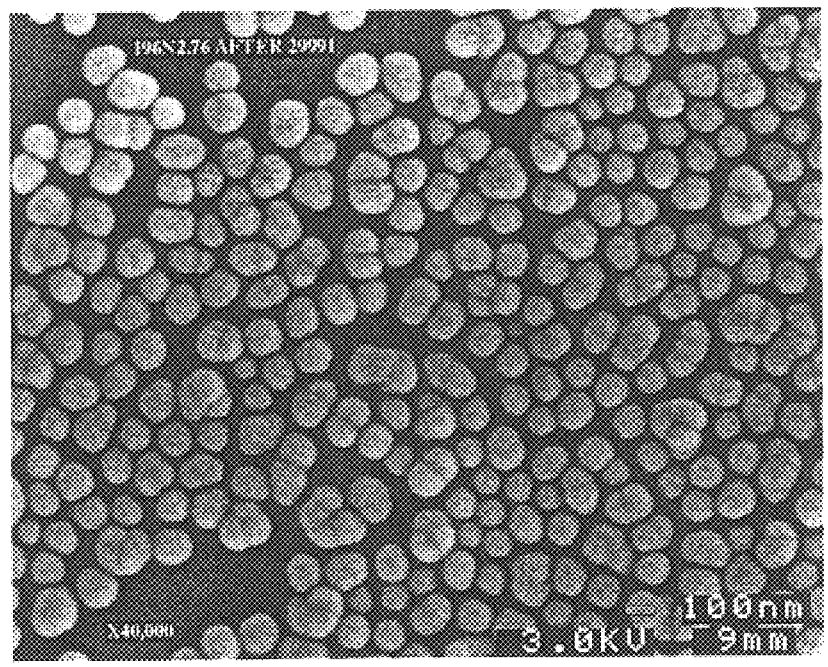
FIGS. 4a and 4b are scanning electron photomicrographs at 40,000 and 80,000 magnification respectively which illustrate non-spherical nodular shaped silica particles according to a second embodiment of the invention.
Figure 4B:
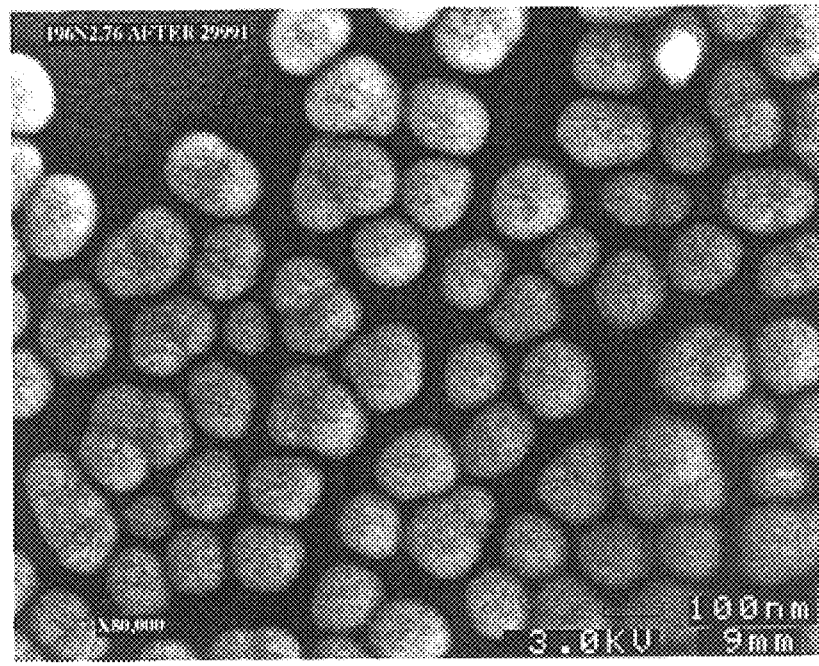
Figure 5A:
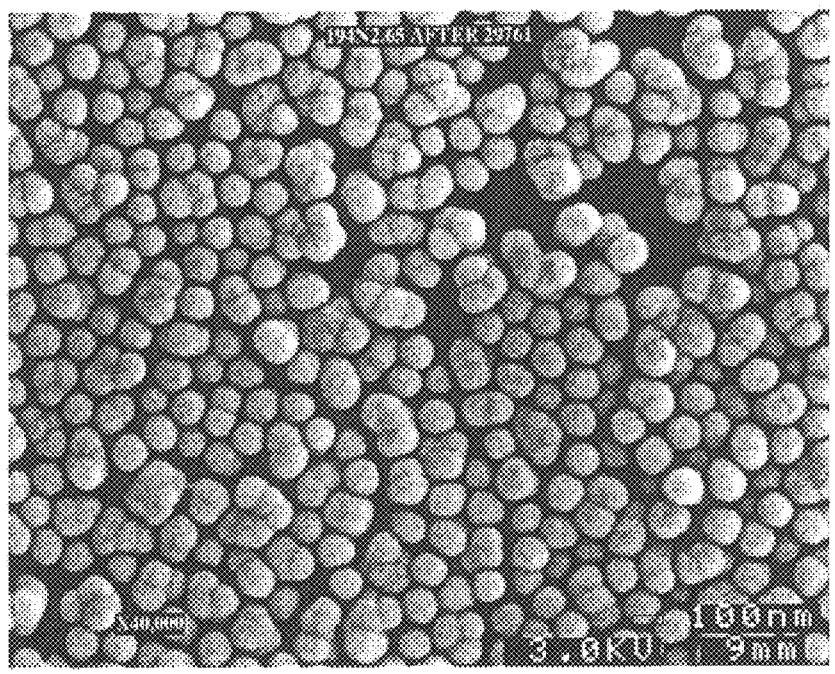
FIGS. 5a and 5b are scanning electron photomicrographs at 40,000 and 80,000 magnification respectively which illustrate non-spherical nodular shaped particles according to a third embodiment of the invention.
Figure 5B:
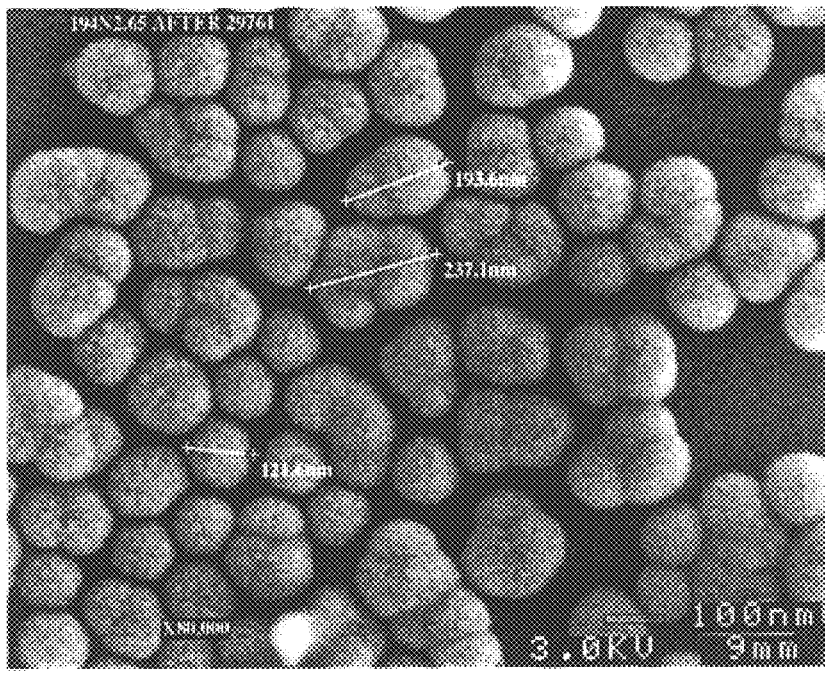
Figure 6A:
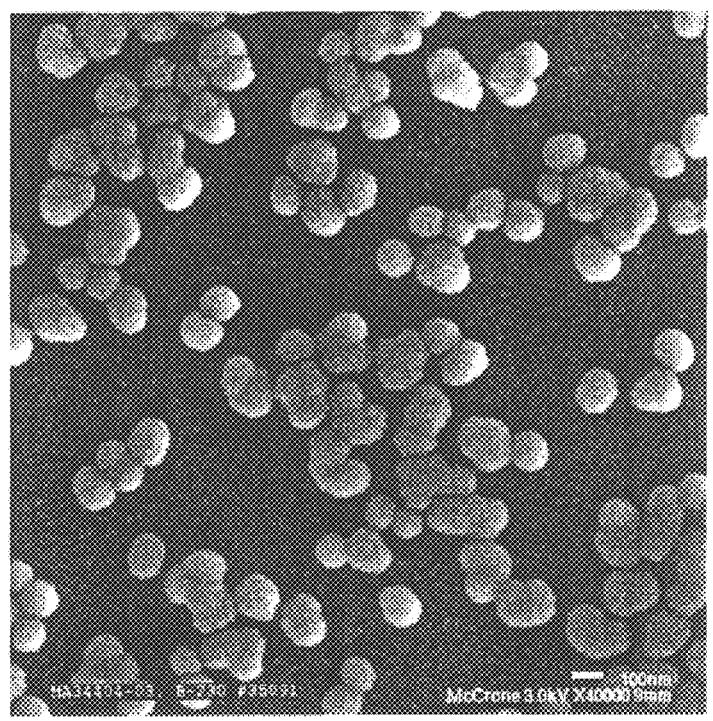
FIGS. 6a and 6b are scanning electron photomicrographs at 40,000 and 80,000 magnification respectively which illustrate the non-spherical nodular shaped particles according to a fourth embodiment of the invention.
Figure 6B:
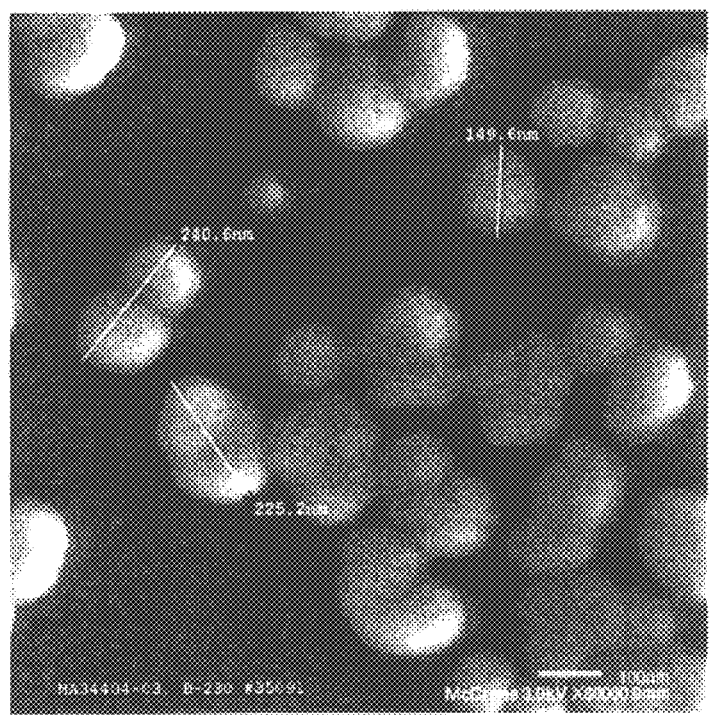
Figure 7A:
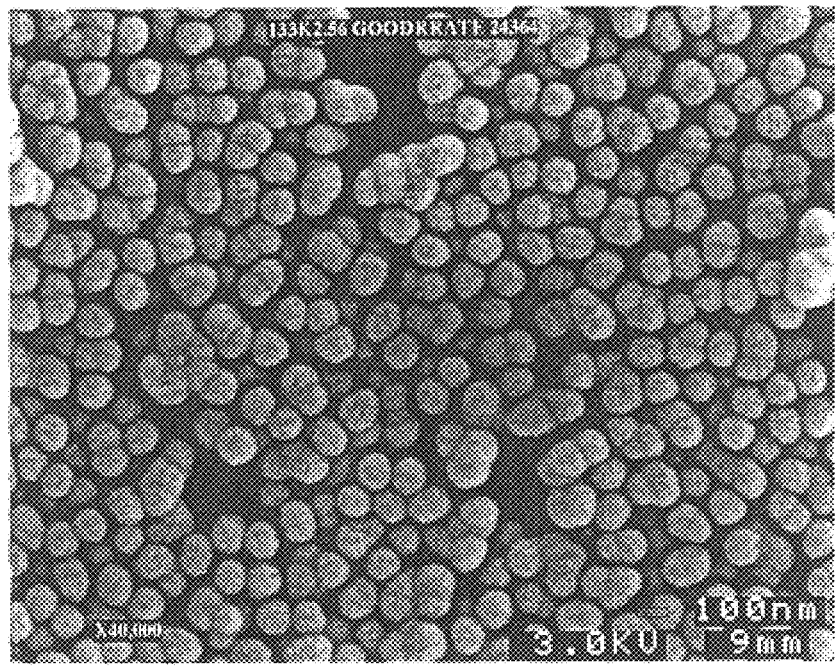
FIGS. 7a and 7b are scanning electron photomicrographs at 40,000 and 80,000 magnification respectively which illustrate non-spherical nodular shaped particles according to a fifth embodiment of the invention.
Figure 7B:
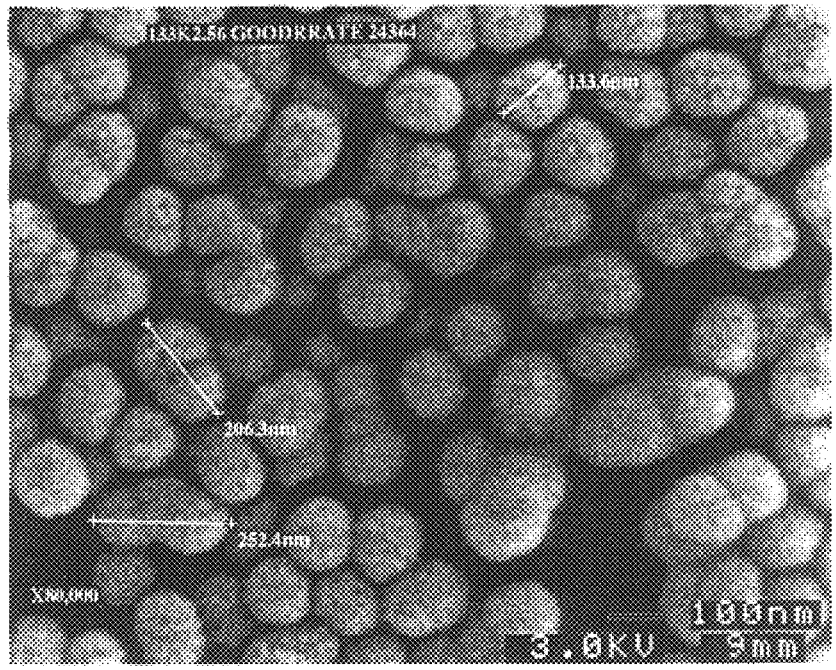

As shown in FIGS. 1a and 1b, the particles of Lot 197N are essentially spherical and therefore less effective in chemical mechanical polishing than those in accordance with the present invention. The particles illustrated in FIGS. 2a and 2b which were taken from Lot 181K are essentially spherical but contain a few nodular particles. FIGS. 3a and 3b show the particles of Lot 157 which are also primarily spherical but contain a small percentage of non-spherical particles. A mixture of spherical and non-spherical nodular particles from Lot 196N is illustrated in FIGS. 4a and b. As illustrated in FIGS. 5a and b the particles of Lot 194 have a larger majority of non-spherical nodular particles while FIG. 6 is a further example of non-spherical nodular particles in accordance with the present invention. Finally, FIGS. 7a and b illustrate the morphology of Lot 133K.

Chemical mechanical polishing slurries suitable for the planarization of oxide dielectric interlayers in the manufacture of integrated circuits are an embodiment of this invention. Such slurries comprise an aqueous dispersion of monodispersed non-spherical nodular silica particles which preferably have a mean effective particle diameter of between about 100 to 300 nanometers. The particle size distribution preferably has a coefficient of variation between about 15 and 25% and a non-spherical nodular shaped silica particle concentration of between about 3 to 15% by weight. Such slurries may be adjusted to a pH of about 9 to about 12 and are preferably adjusted to a pH range of 10.5 to 11.5 by the addition of an alkaline hydroxide such as ammonium hydroxide or potassium hydroxide. With respect to the ammonium hydroxide slurries, the slurry contains less than 1000 ppb by weight sodium, less than 5 ppb by weight chlorine and less than 1 ppb by weight lithium.

The planarization of the conductive layers of integrated circuits presents a unique problem in that they are complex mixed material surfaces. The tungsten plugs (vias) and the electroplated inlaid copper (damascene) structures present the problem of polishing the chemically reactive tungsten and copper and their respective tough, hard, and chemically unreactive Ti/TiN and Ta/TaN diffusion barriers (i.e. metal/metallic compound interlayer structures) and yet not over-polishing or eroding the included oxide insulating layers and not over-polishing or dishing the imbedded tungsten plugs and inlaid copper conductors. This problem is so difficult that most practitioners have resorted to using a dual slurry CMP process, one slurry for the metal and one for the barrier and in so doing have reduced their productivity by one-half.

The non-spherical nodular silica abrasive slurries of this invention when combined with suitable chemistry have been shown to remove the tungsten and copper overlays rapidly and their unique shape is so effective at removing the barrier material that a single polish step can be employed at great economic advantage.

For example, a slurry of mono-dispersed nodular silica particles prepared using the same batch formula presented previously was stripped to an ammonia content of approximately 3.0% and then acidified to pH 4 using reagent grade acetic acid and diluted with DI water to 6% solids. The resulting slurry was used for CMP of tungsten in a structure for forming tungsten vias in LPCVD oxide with Ti/TiN as a barrier between the tungsten and the LPCVD oxide. Hydrogen peroxide was added to the slurry as a tungsten oxidizer in a ratio of 1:1:1, hydrogen peroxide/slurry/acetic acid and the CMP was carried out on a Strasbaugh 6EC polishing machine using a Rodel IC1000-2A polishing pad. Within a two minute polishing period the surface coatings were cleared to the underlying LPCVD oxide. The measured planarization rate was 2400 Å/min and within wafer uniformity was +/−3.5%. The tungsten and Ti/TiN filled via holes were planer with the LPCVD oxide surface. The selectivity of the tungsten/titanium/titanium nitride surface coating during planarization was calculated at 1:1:1. A buff polish or secondary planarization was not necessary since the as polished surface roughness was less than 8.0 Å RMS.

In another example, using the same batch formula a slurry of mono-dispersed nodular silica particles was prepared followed by stripping of the ammonia and ethanol and acidifying to pH 4 with reagent grade potassium hydrogen phthalate and reagent grade nitric acid. The solids content was adjusted to 5% using DI water. Reagent grade 1-H- BTA at a concentration of 0.1 mMol/liter was added as an inhibitor to control the surface corrosion rate of the copper. Hydrogen peroxide was added at a concentration of 7.5 w/o. The resulting slurry was used to planarize 150 mm copper damascene wafers with various trench sizes and pattern densities. The film structure consisted of 2.0 microns of thermal silica, 50 nm of PVD Ta/TaN and 2.3 microns of PVD copper. Planarization was performed using a Cybec 3900 polishing machine and a Rodel IC 1400 k groove polishing pad. The polishing parameters used were 2.8 psi down-force, 86 fpm velocity, and slurry flow rate of 300 ml/min at a temperature of 25°–30° C. All the copper and Ta/TaN were removed in one polish step lasting 180 seconds. There was less than 50 nm of copper dishing and virtually no silica erosion. The calculated copper and Ta/TaN removal rates were 7000 to 8000 Å/min and 12,000 to 14,000 A/min respectively. The extremely rapid Ta/TaN removal rate allows this to be a one step polishing process utilizing a single slurry thus greatly increasing utility over the present technology practice of using a two step process with two different slurries. The chemistry used in this slurry formulation is similar to those used presently in the two step process employing different abrasive media so the difference can only be attributed to the performance of the nodular silica abrasive particles.

While the invention has been described in connection with its preferred embodiments, it should be recognized that changes and modifications may be made therein without departing from the scope of the appended claims.

What is claimed is:

1. An abrasive media comprising non-spherical silica particles having nodular morphology and maximum liner dimensions between about 20 to 1000 nanometers for chemical mechanical polishing.

2. Abrasive media for use in chemical mechanical polishing comprising at least 50 percent by particle weight of non-spherical silica particles having nodular morphology and maximum linear dimensions between about 20 to 1000 nanometers.

3. Abrasive media for use in chemical mechanical polishing according to claim 2 which contains at least 90 percent by particle weight of non-spherical silica particles having nodular morphology and maximum linear dimensions between about 20 to 1000 nanometers.

4. Abrasive media according to claim 1 wherein the maximum linear dimensions of the particles are between about 100 to 300 nanometers.

5. Abrasive media according to claim 1 which are produced by the coalescence of nuclei of less than about 100 nanometers and grown through the hydrolysis of an alkoxysilane or an alkoxyalkylsilane in a mixed solution of water alcohol and an alkaline catalyst.

6. Abrasive media according to claim 5 wherein the alkoxysilane is tetraethyl orthosilicate.

7. Abrasive media according to claim 5 wherein the alkoxysilane is tetramethyl orthosilicate.

8. Abrasive media according to claim 5 wherein the alkaline catalyst is ammonium hydroxide.

9. Abrasive media according to claim 2 wherein said particles have a mean effective diameter of between about 100 to 300 nanometers and a particle size distribution with a coefficient of variation of the effective diameters of said particles between about 15 and 25.

10. Abrasive media according to claim 1 wherein said nodular silica particles contain less then 0.10 weight percent lithium.

11. Abrasive media according to claim 1 wherein said nodular silica particles contain less than 1000 ppb by weight sodium and less than 5 ppb by weight chlorine.

12. Abrasive media according to claim 1 in which a majority of said non-spherical nodular silica particles have been formed by the coalescence of two or more nuclei with additional growth after coalescence.

13. Abrasive media according to claim 12 comprising non-spherical nodular silica particles having maximum linear dimensions between about 100 to about 300 nanometers and wherein a majority of said particles have been formed by the coalescence of between two and six nuclei with additional growth after coalescence.

14. Abrasive media according to claim 1 in which a majority of said non-spherical nodular silica particles have been formed from the coalescence of between two to six nuclei.

15. Aqueous slurries for use in chemical mechanical polishing containing a particulate abrasive media in a concentration of from about 0.5 to about 50% by weight wherein more than one-half of the weight of particles are monodispered non-spherical nodular shaped silica particles according to claim 1.

16. A slurry according to claim 15 wherein the slurry contains spherical silica particles and wherein the slurry contains less than 1/10 the number of spherical silica particles as the number of non-spherical nodular silica particles.

17. A slurry according to claim 15 in which said concentration of silica particles is between about 3 to about 25% by weight.

18. A slurry according to claim 15 wherein the mean effective diameter of said nodular silica particles is between about 100 nanometers and about 300 nanometers.

19. A slurry according to claim 15 wherein said slurry contains less than 0.01% by weight sodium, less than 0.01% chlorine and less than 0.01% by weight lithium.

20. A slurry according to claim 15 wherein the slurry has a pH of between about 9 and 12.

21. A slurry according to claim 15 wherein the slurry has a pH of between about 10.5 to 11.5.

22. A slurry according to claim 20 which contains an alkaline hydroxide.

23. A slurry according to claim 20 which contains KOH.

24. A slurry according to claim 20 which contains $NH_4OH$.

25. A slurry according to claim 20 which contains from about 0.5 to 5 weight percent alcohol.

26. A slurry for chemical mechanical polishing of an oxide glass including the abrasive media of claim 2.

27. A slurry for chemical mechanical polishing of a metal or metal-metallic compound interlayer structure which incorporates the abrasive media of claim 2.

28. A slurry according to claim 15 wherein the slurry has a pH adjusted to between about 2 and about 6 by a material selected from the group consisting of inorganic acids, organic acids, acid precursors and mixtures thereof.

29. A slurry according to claim 28 which includes material selected from the group consisting of chemical oxidizing agents, chemical complexing agents, chemical passivating agents and mixtures thereof to render the slurry suitable for the chemical mechanical polishing of a metal or metal/metallic interlayer structures.

30. A slurry according to claim 28 wherein hydrogen peroxide has been added to render the slurry suitable for the chemical mechanical polishing of copper and tantalum/tantalum nitride interlayer structures.

31. A slurry according to claim 28 wherein hydrogen peroxide and acetic acid have been added to render the slurry suitable for the chemical mechanical polishing of tungsten and titanium/titanium nitride interlayer structures.

* * * * *

UNITED STATES PATENT AND TRADEMARK OFFICE
CERTIFICATE OF CORRECTION

PATENT NO. : 6,334,880 B1
DATED : January 2, 2002
INVENTOR(S) : Negrych et al.

It is certified that error appears in the above-identified patent and that said Letters Patent is hereby corrected as shown below:

<u>Title page,</u>
Item [75], Inventors, please correct the name of the inventors to read:
-- John A. Negrych, Adrian; George Haag, Manitou Beach; Peter E. Rau, Morenci; William J. Corbett, Weston, all of MI (US) --

Signed and Sealed this

Twentieth Day of August, 2002

*Attest:*

JAMES E. ROGAN
*Attesting Officer*    *Director of the United States Patent and Trademark Office*